United States Patent
Kimura

(10) Patent No.: US 7,289,166 B2
(45) Date of Patent: Oct. 30, 2007

(54) INFORMATION PROCESSING APPARATUS AND METHOD OF DISPLAYING REMAINING BATTERY CAPACITY OF THE INFORMATION PROCESSING APPARATUS

(75) Inventor: Takuji Kimura, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 459 days.

(21) Appl. No.: 10/927,533

(22) Filed: Aug. 27, 2004

(65) Prior Publication Data

US 2005/0046390 A1 Mar. 3, 2005

(30) Foreign Application Priority Data

Aug. 29, 2003 (JP) ............................. 2003-306793

(51) Int. Cl.
*H04N 5/63* (2006.01)
(52) U.S. Cl. ............... 348/730; 348/563; 348/569; 725/134; 725/142; 320/133; 320/132
(58) Field of Classification Search ............... 320/133, 320/132; 348/730, 563, 569; 725/134, 142
See application file for complete search history.

(56) References Cited

U.S. PATENT DOCUMENTS 4,675,667 A * 6/1987 Nakamura et al. ............. 345/92

FOREIGN PATENT DOCUMENTS

| DE | EP-198516 | * | 4/1985 |
| JP | 05075472 | * | 3/1993 |
| JP | 08179018 | * | 7/1996 |
| JP | 11289677 | * | 10/1999 |
| JP | 2000049911 | * | 2/2000 |
| JP | 2000224701 | * | 8/2000 |
| JP | 2002359673 | * | 9/2000 |
| JP | 2001051029 | * | 2/2001 |
| JP | 2001051031 | * | 2/2001 |
| JP | 2000253587 | * | 12/2002 |
| JP | 2003-152579 | | 5/2003 |

OTHER PUBLICATIONS

Machine translation of JP-2003152579.*
Machine translation of JP-11289677.*

* cited by examiner

*Primary Examiner*—Bao Q. Vu
*Assistant Examiner*—Samuel Berhanu
(74) *Attorney, Agent, or Firm*—Pillsbury Winthrop Shaw Pittman, LLP

(57) ABSTRACT

An information processing apparatus has a battery portion which supplies power, a remaining capacity detecting portion which detects a remaining capacity of the battery portion, a remaining time computing portion which computes a remaining time during which processing of an application for information processing can be carried out by the power supplied from the battery portion, on the basis of the remaining capacity detected by the remaining capacity detecting portion, and a display portion which displays the remaining time computed by the remaining time computing portion. In this manner, a user can know a time of an application which can be used with a current remaining battery capacity from a screen.

6 Claims, 11 Drawing Sheets

| Functions | Power consumption | Time display example |
|---|---|---|
| Television receiving processing, decoding processing (13 segments), display processing | 3000mw | 1H |
| Television receiving processing, decoding processing (1 segment), display processing | 500mw | 6H |
| Television receiving processing, decoding processing (1 segment), recording processing | 400mw | 7.5H |
| Television receiving processing, recording processing | 200mw | 15H |
| Recording processing for motion image | 200mw | 15H |
| Reproduction processing for motion image | 150mw | 20H |
|  |  |  |
| Game play (video game mainly composed of dynamic image and voice) | 2000mw | 1.5H |
| Game play (table game mainly composed of still image) | 150mw | 20H |
|  |  |  |
| Wait processing of portable phone | 50mw | 60H |
| Communication processing of portable phone | 200mw | 15H |
|  |  |  |
| Radio receiving processing | 100mw | 3H |
| Radio recording processing | 500mw | 6H |
| Voice file reproduction processing | 200mw | 15H |
|  |  |  |
| Recording processing for still image | 50mw | 60H |
| Reproduction processing for still image | 100mw | 30H |
|  |  |  |
| Basic function (example: wait processing after communication processing of 10 minutes by portable phone) | 33mw+ 50mw | 59H |

FIG. 4

INFORMATION PROCESSING APPARATUS AND METHOD OF DISPLAYING REMAINING BATTERY CAPACITY OF THE INFORMATION PROCESSING APPARATUS

CROSS-REFERENCE TO RELATED APPLICATIONS

This application is based upon and claims the benefit of priority from prior Japanese Patent Application No. 2003-306793, filed Aug. 29, 2003, the entire contents of which are incorporated herein by reference.

BACKGROUND OF THE INVENTION

1. Field of the Invention

The present invention relates to an information processing apparatus for transmitting, receiving, recording, and reproducing voice information or video image information, and more particularly, to an information processing apparatus for displaying a remaining battery capacity and a method of displaying a remaining battery capacity of the information processing apparatus.

2. Description of the Related Art

As is well known, in a variety of technical fields, apparatuses for processing various types of diversified information are currently becoming popular and popular. These apparatuses are prone to uniformly small sized, and it is required to operate a plenty of applications for a long period of time by a power source using a compact battery portion.

In a prior art (Jan. Pat. Appln. KOKAI Publication No. 2003-152579), there is disclosed a mobile receiver unit and a terrestrial digital broadcast transmission system. Herein, there is exemplified an example of decoding a broadcast signal by one segment as well as decoding the signal by 13 segments in order to restrict power consumption. In this manner, in a mobile receiver unit which is small sized and uses a battery with small capacity as well, it becomes possible to receive a digital broadcast for a comparatively long period of time.

However, in the above-described prior art, there is an inconvenience that specific information as to how long the information processing apparatus can be used with a current remaining battery capacity is not provided to a user. That is, for example, in a portable phone, the remaining capacity of a battery is displayed to some extent. However, in the recent years, there has been a number of information processing apparatuses having a plurality of functions as well as a single function. Therefore, there has been an inconvenience that a user cannot know how long the information processing apparatuses can be used for each application.

BRIEF SUMMARY OF THE INVENTION

According to one embodiment of the present invention, there is provided an information processing apparatus, comprising: a battery portion which supplies power; a remaining capacity detecting portion which detects a remaining capacity of the battery portion; a remaining time computing portion which computes a remaining time during which an application for carrying out information processing by the power supplied from the battery portion can be carried out on the basis of the remaining capacity detected by the remaining capacity detecting portion; and a display portion which displays the remaining time computed by the remaining time computing portion.

BRIEF DESCRIPTION OF THE SEVERAL VIEWS OF THE DRAWING

FIG. 4 is a view showing an example of a relationship between each function and power consumption of the information processing apparatus according to the present invention;

DETAILED DESCRIPTION OF THE INVENTION

Hereinafter, embodiments of the present invention will be described in detail with reference to the accompanying drawings.

(Configuration and Basic Operation)

Now, a configuration of an information processing apparatus according to the present invention will be described in detail with reference to the accompanying drawings.

Figure 1:
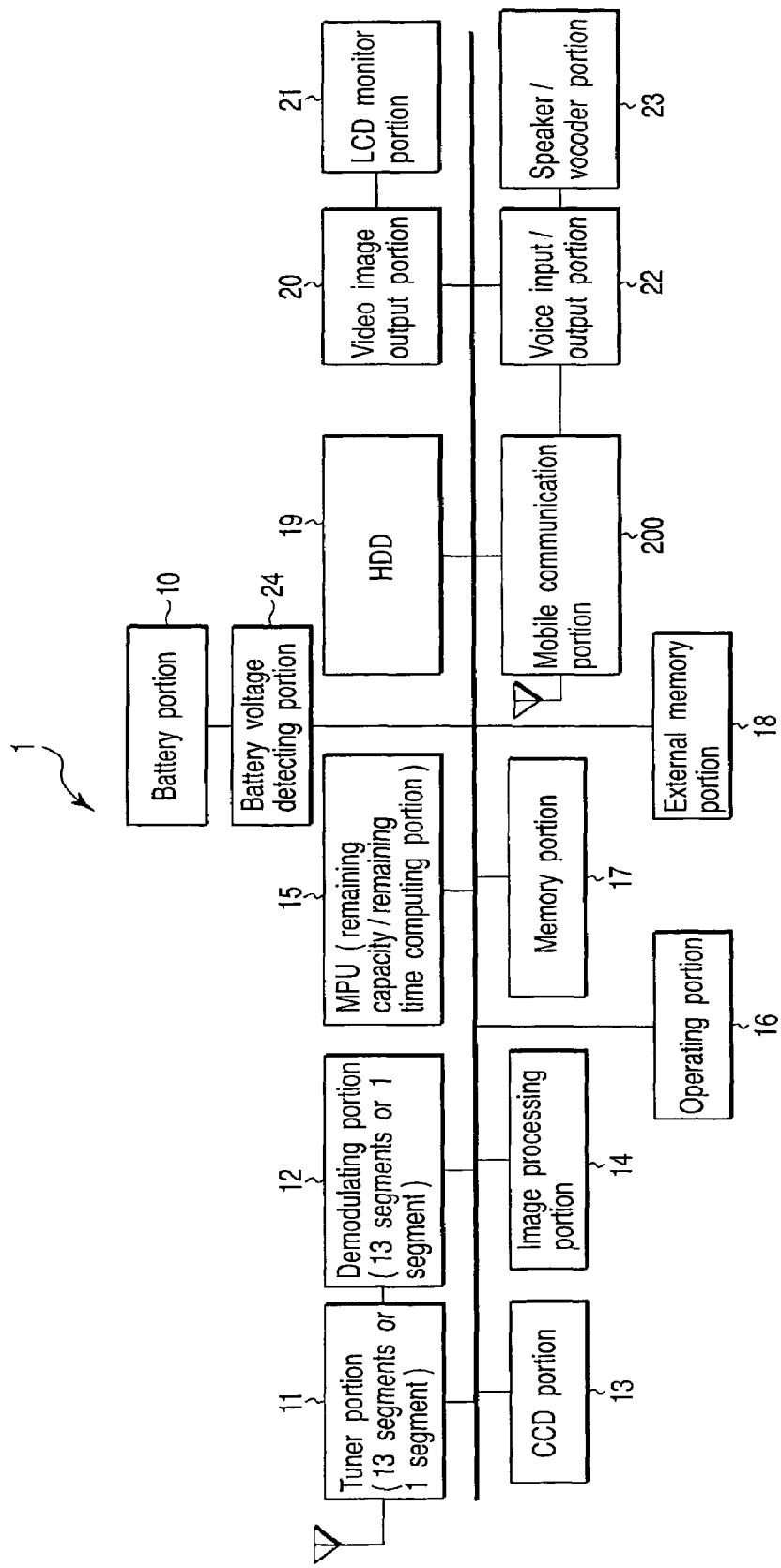
FIG. 1 is a block diagram depicting one embodiment of an information processing apparatus according to the present invention.

In an information processing apparatus 1 according to the present invention, as shown in FIG. 1, there are provided to be connected to a bus line: a tuner portion 11 for receiving a general high image quality broadcast (13-segment broadcast) which is a terrestrial digital broadcast and a low data rate broadcast (1-segment broadcast); and a demodulating portion 12 for demodulating these broadcasts, respectively. Further, the apparatus further comprises: a CCD portion 13 for capturing a still image or a motion image; and an image processing portion 14 for carrying out image processing such as broadcast image information captured by the tuner portion 11 and demodulating portion 12 or still image information and motion image information captured by the CCD portion 13. Furthermore, there is provided to be connected to a bus line: a memory portion 17 for storing a variety of programs such as a game application. Moreover, a mobile communication portion 200 for a mobile telephone function is provided to be connected to a bus line.

Further, an MPU 15 controlling a whole operation and an operating portion 16 receiving a user's operational command are provided to be connected to a bus line. This MPU 15 has a computing portion for computing a remaining capacity and a remaining time of a battery described later by operating together with a program or the like of a memory portion 17. Further, the information processing apparatus 1 comprises an external memory portion 18 for connecting an externally removable recording medium. This apparatus also comprises: a hard disk drive 19 for storing an application program or the like such as image information or voice information to be recorded; a battery portion 10 for supplying power for operating each of the above-described units; a battery voltage detecting portion 24 for detecting a voltage of the battery portion 10; a video image output portion 20 for processing and outputting video image information on a still image or a motion image; an LCD (Liquid Crystal Display) monitor portion 21 connected to the output portion and displaying a video image; a voice input/output portion 22 for processing a voice signal, and exchanging the voice signal with a speaker or vocoder portion 23.

In addition, in another embodiment of the information processing apparatus according to the present invention, as a mobile TV, it is preferred that an adapter such as a tuner card for receiving a digital broadcast is connected to a device such as a notebook type personal computer (PC), thereby functioning as a portable TV receiver unit. In this case, demodulation processing in the tuner card can cope with both of a 13-segment broadcast and a 1-segment broadcast. In addition, decoding of a compressed and encoded video image or voice outputted from the tuner card is carried out by software using a CPU of a notebook type PC. In general, the 13-segment broadcast and 1-segment broadcast differ from each other in compression encoding system. However, in any case, decoding can be carried out by switching software.

Figure 2:
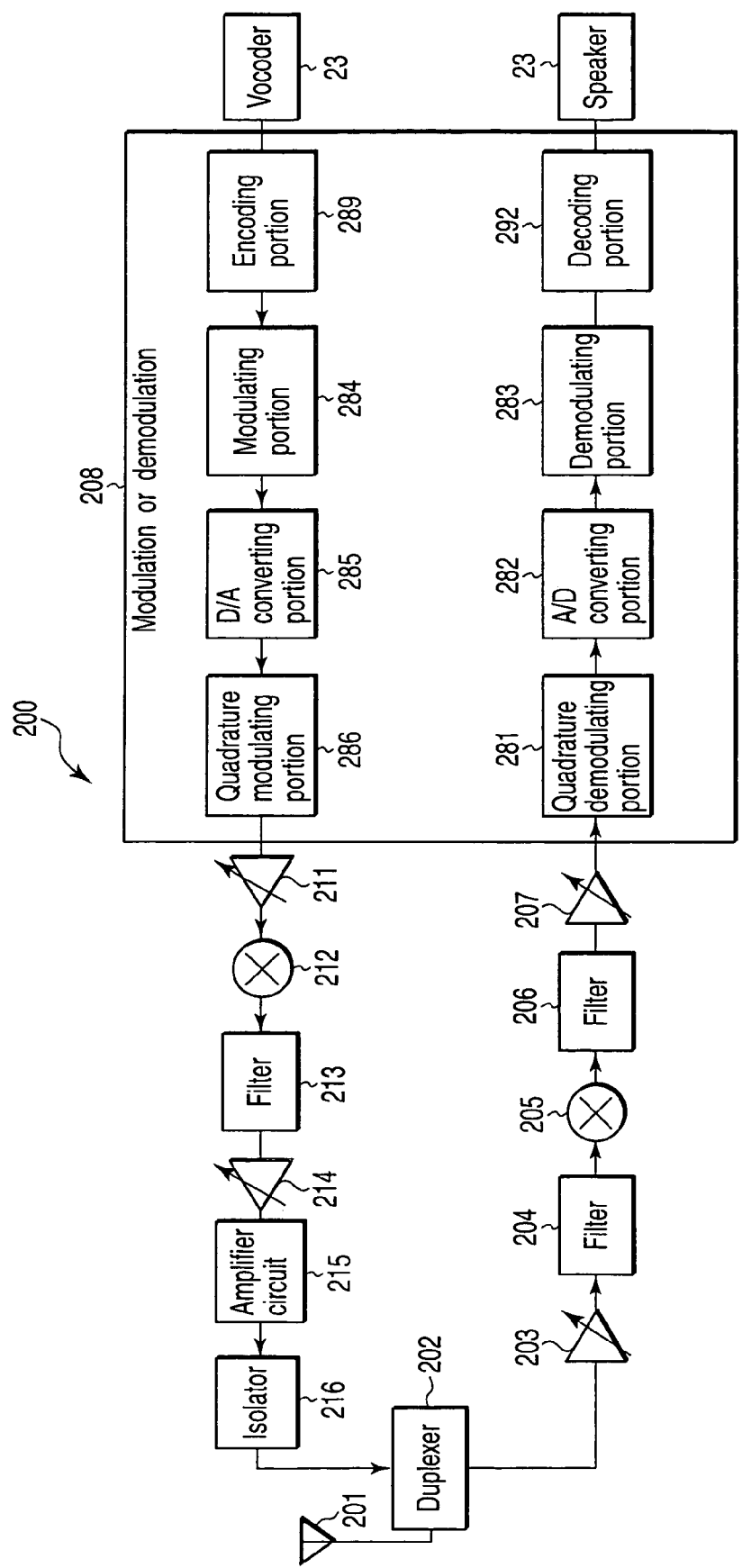
FIG. 2 is a block diagram depicting an example of a mobile communication portion which the information processing apparatus according to the present invention comprises.

Further, a configuration of a mobile communication portion 200 for the above-described mobile telephone function will be described with reference to FIG. 2. The mobile communication portion 200 comprises:

an antenna 201; a duplexer 202; an RF receiving gain variable amplifier 203; an RF bandwidth limiting filter 204; a frequency converter 205; an IF bandwidth limiting filter 206; an IF receiving gain variable amplifier 207; a modulating/demodulating portion 208; an IF transmission gain variable amplifier 211; a frequency converter 212; an RF bandwidth limiting filter 213; an RF transmission gain variable amplifier 214; a power amplifier 215; an isolator 216; a vocoder 23; and a speaker 23.

The modulating/demodulating portion 208 includes: for example, a quadrature demodulating portion 281; an A/D converting portion 282; an information signal demodulating portion 283; and a decoding portion 292. Further, this modulating/demodulating portion is composed of: an encoding portion 289 for encoding a signal from the vocoder; an information signal modulating portion 284; a D/A converting portion 285; and a quadrature modulating portion 286. In this configuration, a signal quadrature-demodulated by the quadrature demodulating portion 281 is A/D converted by means of the A/D converting portion 282; the thus A/D converted signal is demodulated as an information signal by means of the signal demodulating portion 283; and the demodulated signal is outputted after decoded by the decoding portion 292.

In such a configuration, receiving processing of the mobile communication portion 200 will be described here. A forward link signal transmitted from a base station is received by the antenna 201, and only a component in a receiving signal bandwidth is filtered by the duplexer 202. The filtered component is amplified or attenuated by the RF receiving gain variable amplifier 203. An unwanted component is filtered by the RF bandwidth limiting filter 204, and the thus filtered component is converted by frequency from an RF band to an IF band by the frequency converter 2005. An unwanted component is filtered by the IF bandwidth limiting filter 206, and the filtered component is amplified or attenuated by the IF receiving gain variable amplifier 207, and then inputted to the modulating/demodulating portion 208.

The modulating/demodulating portion 208 is composed of, for example, the quadrature demodulating portion 281, the A/D converting portion 282, the information signal demodulating portion 283, the information signal modulating portion 284, the D/A converting portion 285; and the quadrature modulating portion 286.

Here, it is preferred that the encoding portion 289 and the decoding portion 292 are encoded or decoded based on common decoding key information, and unreasonable hearing of voice information communicated by encoding processing is prevented. However, strictly, encoding key information for encoding from a transmitting side mobile communication portion and key information associated with the receiving side decoding portion 292 may be shared in common.

Receiving processing of the mobile communication portion 200 having this configuration will be described below. A signal quadrature-demodulated by the quadrature demodulating portion 281 is A/D converted by the A/D converting portion 282, and is demodulated as an information signal by the signal demodulating portion 283. Further, the demodulated information signal is decoded by the decoding portion 292, and then outputted as a voice to a speaker 23.

Moreover, transmission processing of this mobile communication portion 200 will be described below. A reverse link signal transmitted from a mobile station is provided by a vocoder 287, and the reverse link signal is encoded by the encoding portion 289. The thus encoded encode signal is outputted after modulated by the information signal modulating portion 284, and then, the outputted signal is D/A converted by the D/A converting portion 285, and is quadrature-modulated by the quadrature modulating portion 286. The quadrature-modulated signal is amplified or attenuated by the IF transmission gain variable amplifier 211, and is then converted by frequency from an ID band to an RF band by the frequency converter 212. An unwanted component is filtered by the RF bandwidth limiting filter 213, is amplified or attenuated by the RF transmission gain variable amplifier 214, and is amplified by the power amplifier 215. Only a component in a transmission signal bandwidth is filtered by the duplexer 202 via the isolator 216, and the filtered component is transmitted in space by the antenna 201.

Figure 13:
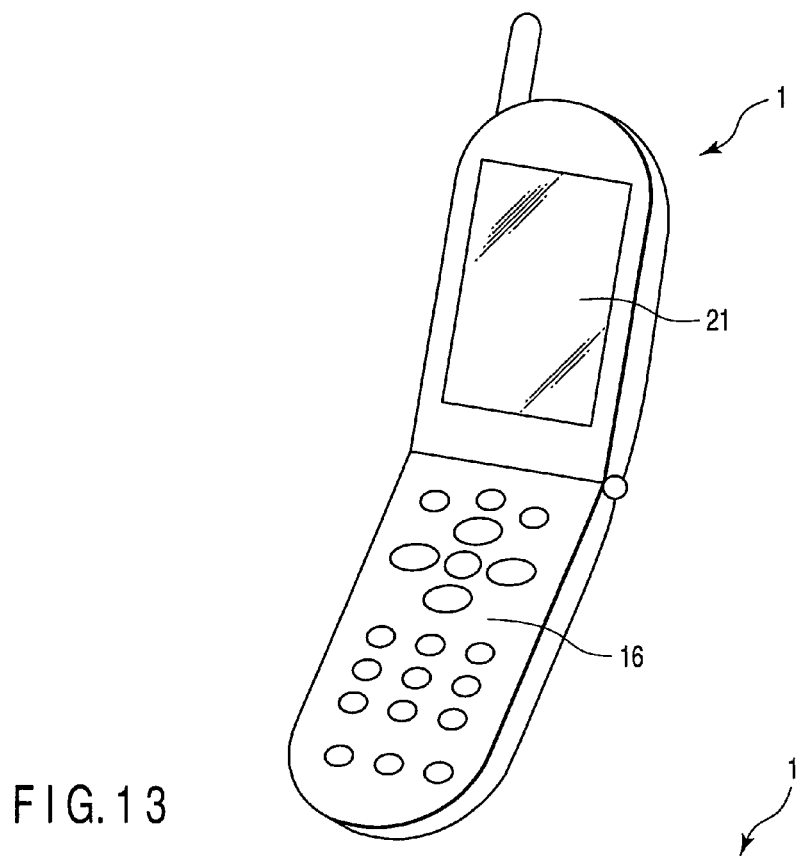
FIG. 13 is an explanation view illustrating an example of an external view of the information processing apparatus according to the present invention.
Figure 14:
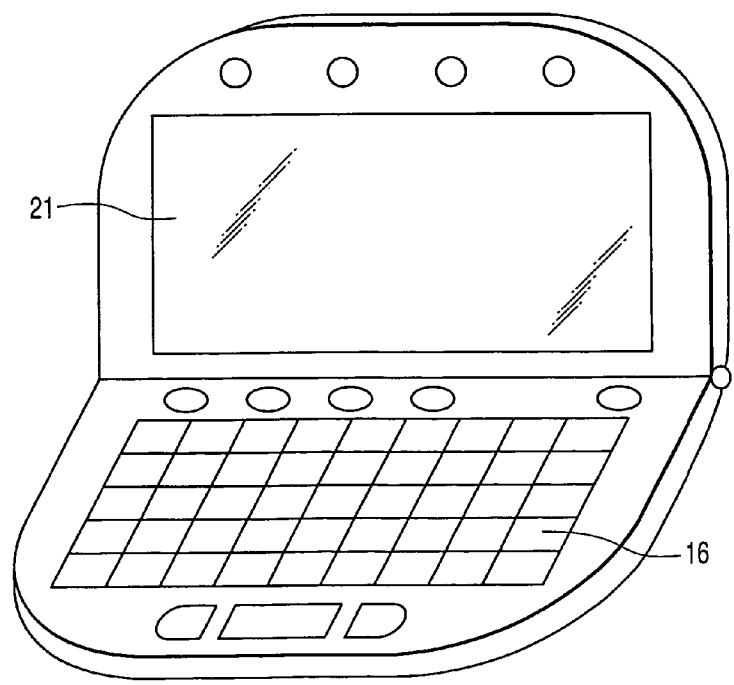
FIG. 14 is another illustrative view illustrating another example of the external view of the information processing apparatus according to the present invention.

It is preferred that the information processing apparatus 1 according to the present invention takes a form of a mobile telephone set, as an example, as shown in FIG. 13. Further, as shown in FIG. 14, it is possible to take a form of PDA (Personal Digital Assistants). In this case, it is preferred that a mobile telephone function is achieved by means of a headphone with a microphone.

With the above-described configuration, the information processing apparatus 1 according to the present invention receives a television broadcast such as digital terrestrial wave or the like with functions of the tuner portion 11 and the demodulating portion 12 under the control of the MPU 15. This apparatus can record the received broadcast signal into the HDD 19 or the like and can reproduce an externally provided motion image file. Further, similarly, under the control of the MPU 15, a video image signal acquired from the CCD portion 13 can be recorded into the HDD 19 or the like, and the recorded motion image file can be reproduced. Similarly, with functions of the tuner portion 11 and demodulating portion 12, a radio broadcast or the like can be received and recorded. Further, with functions of the demodulating portion 12 or voice input/output portion 22, a voice file or the like stored in the HDD 19 or the like is reproduced. A still image can be recorded or reproduced similarly. Furthermore, a video game mainly composed of a motion image or voice or a table game mainly composed of a still image can be played according to a program stored in the memory portion 17 or the FDD 19. Moreover, under the control of the MPU 15, with the function of the above-described mobile communication portion 200, it becomes possible to make communication with another telephone set by using a mobile telephone function. In addition, another application program is stored in the HDD 19 or the like, and is operated under the control of the MPU 15 or the like, thereby making it possible to have an arbitrary function.

(Function for Displaying Remaining Battery Capacity)

Figure 3:
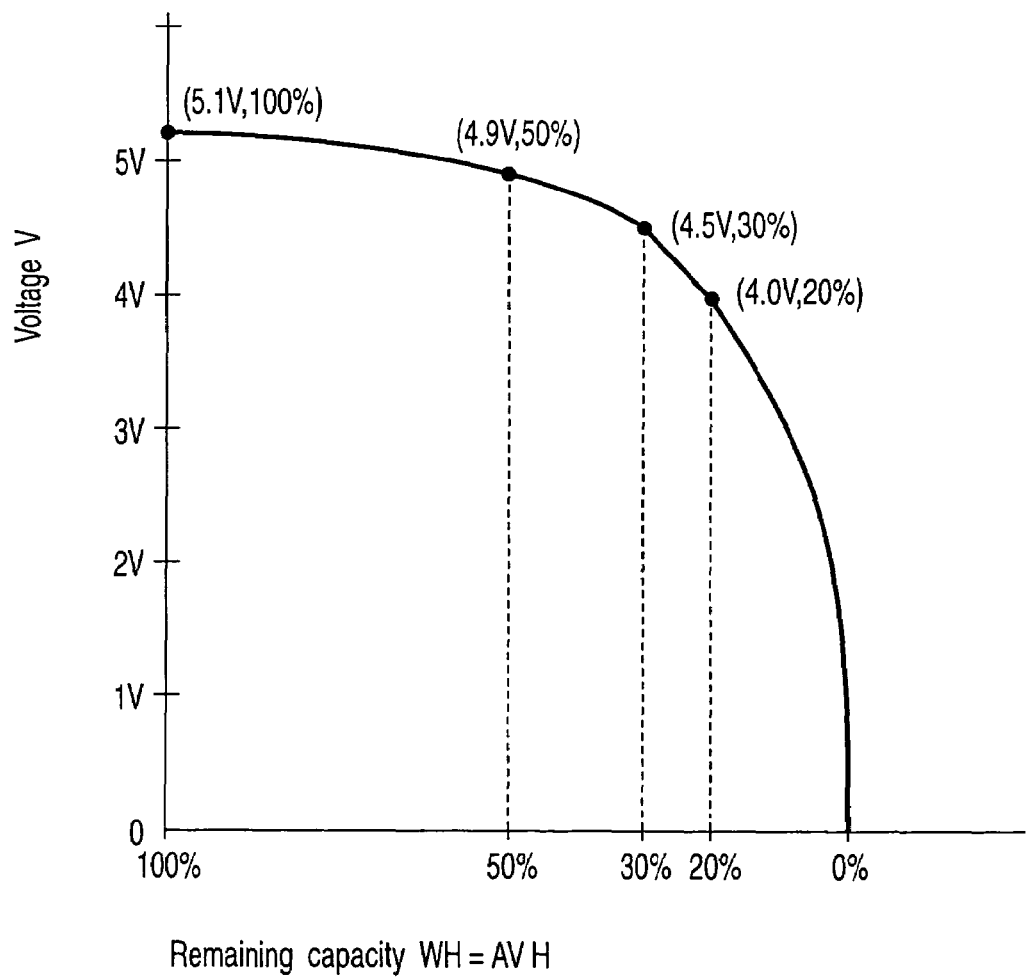
FIG. 3 is a graph depicting a voltage-capacity curve of a battery which the information processing apparatus according to the present invention uses.
Figure 5:
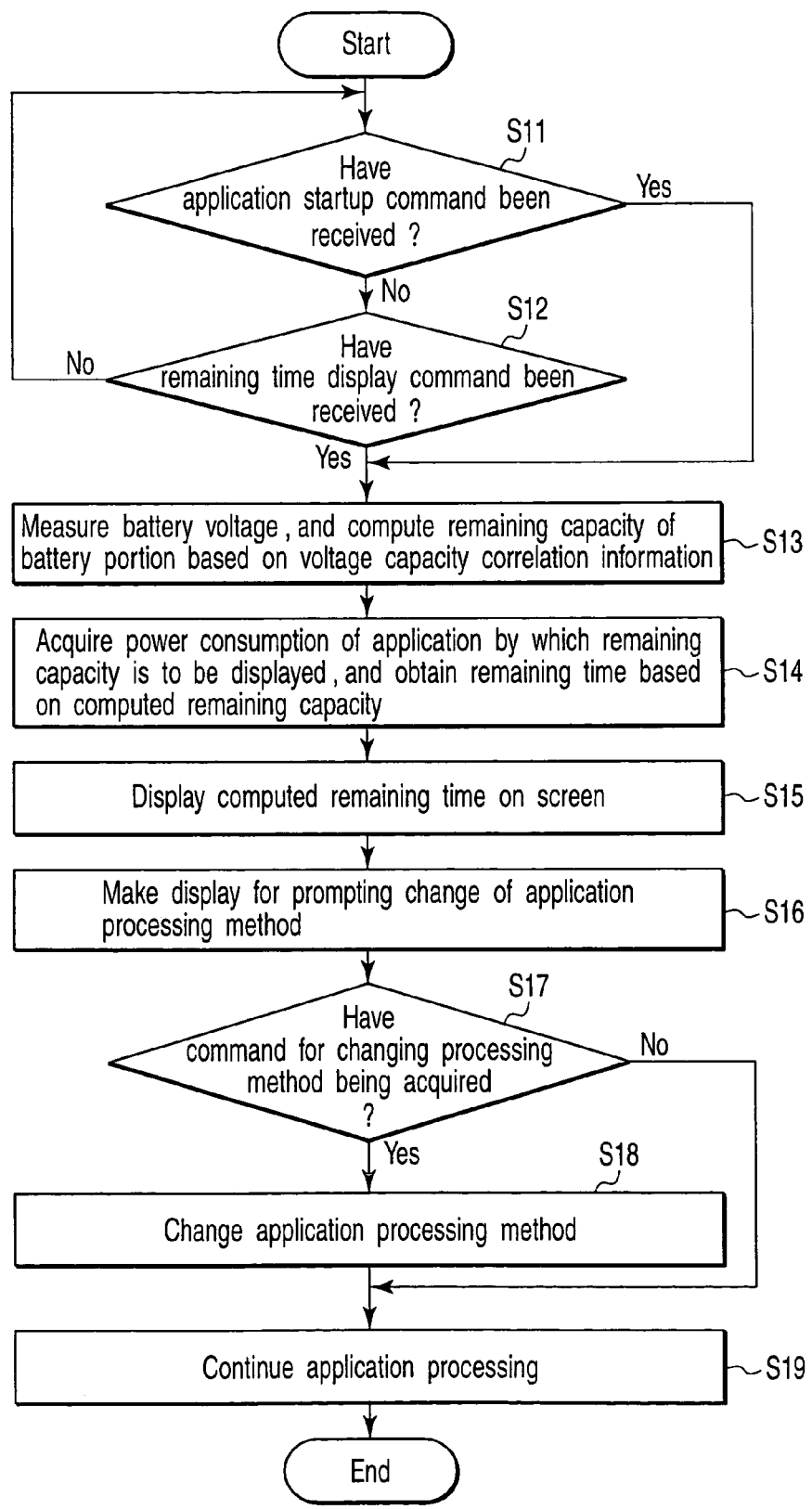
FIG. 5 is a flow chart showing an example of an operation of the information processing apparatus according to the present invention.
Figure 6:
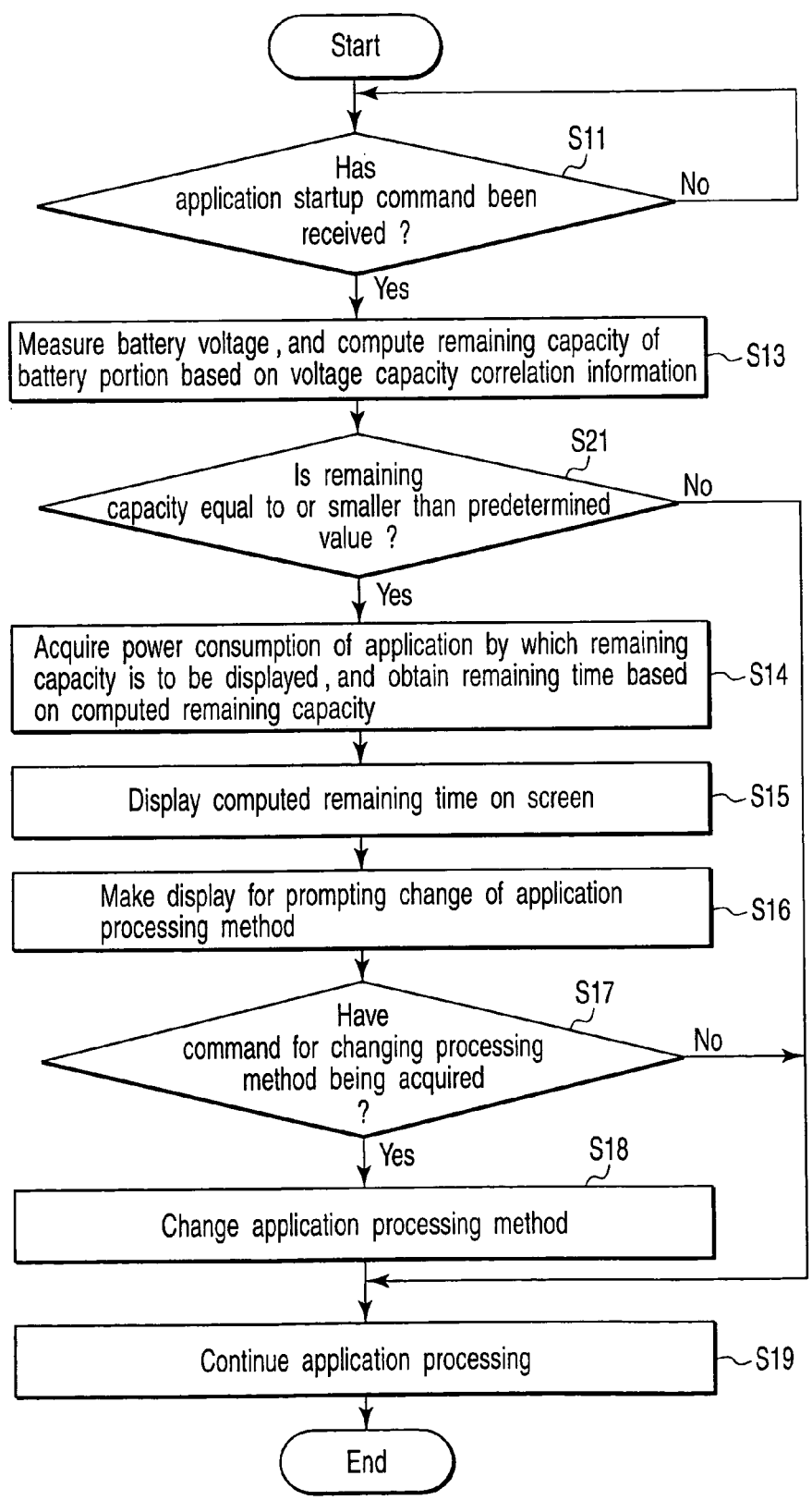
FIG. 6 is a flow chart showing another example of the operation of the information processing apparatus according to the present invention.
Figure 7:
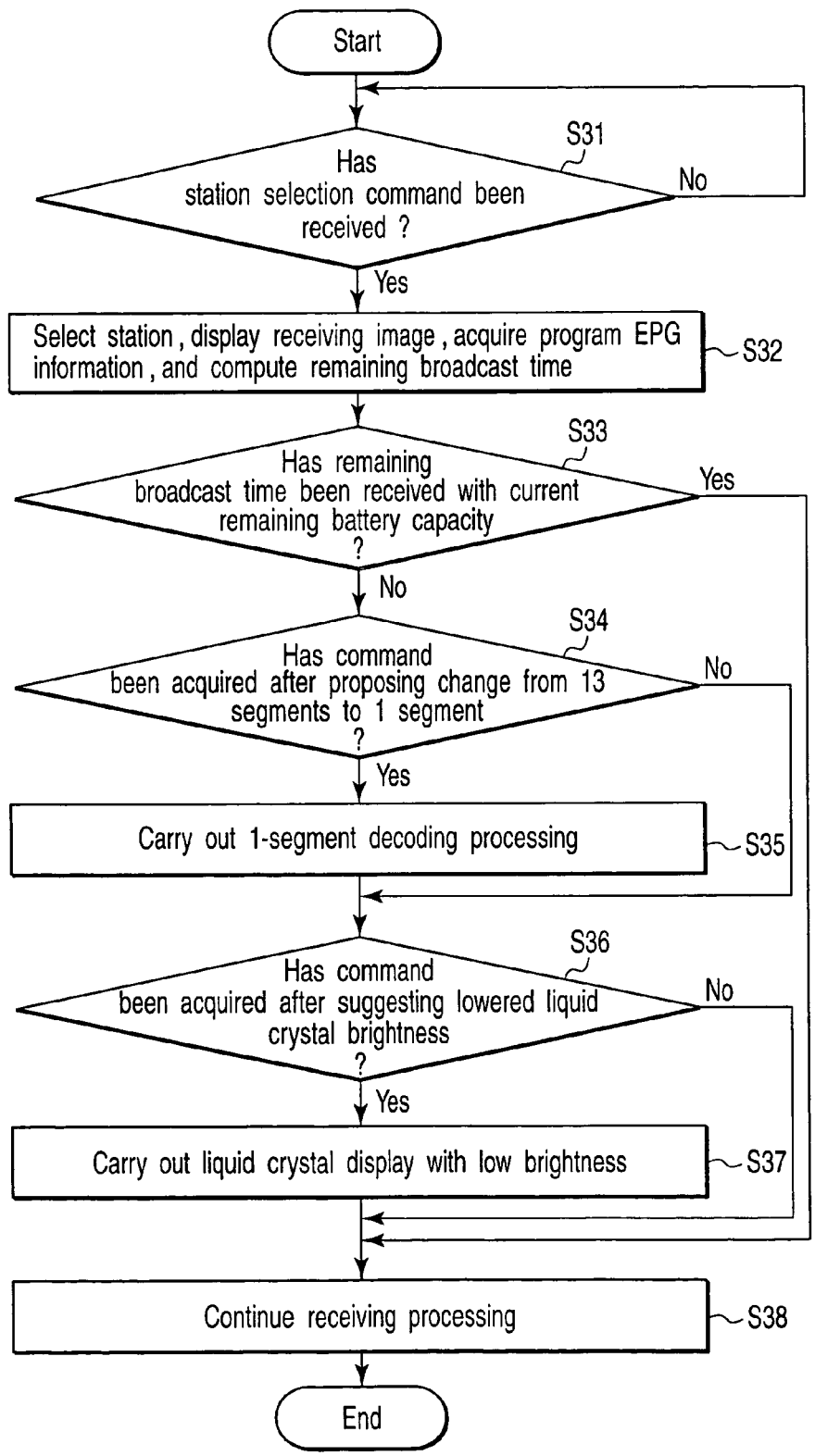
FIG. 7 is a flow chart showing another example of the operation of the information processing apparatus according to the present invention.
Figure 8:
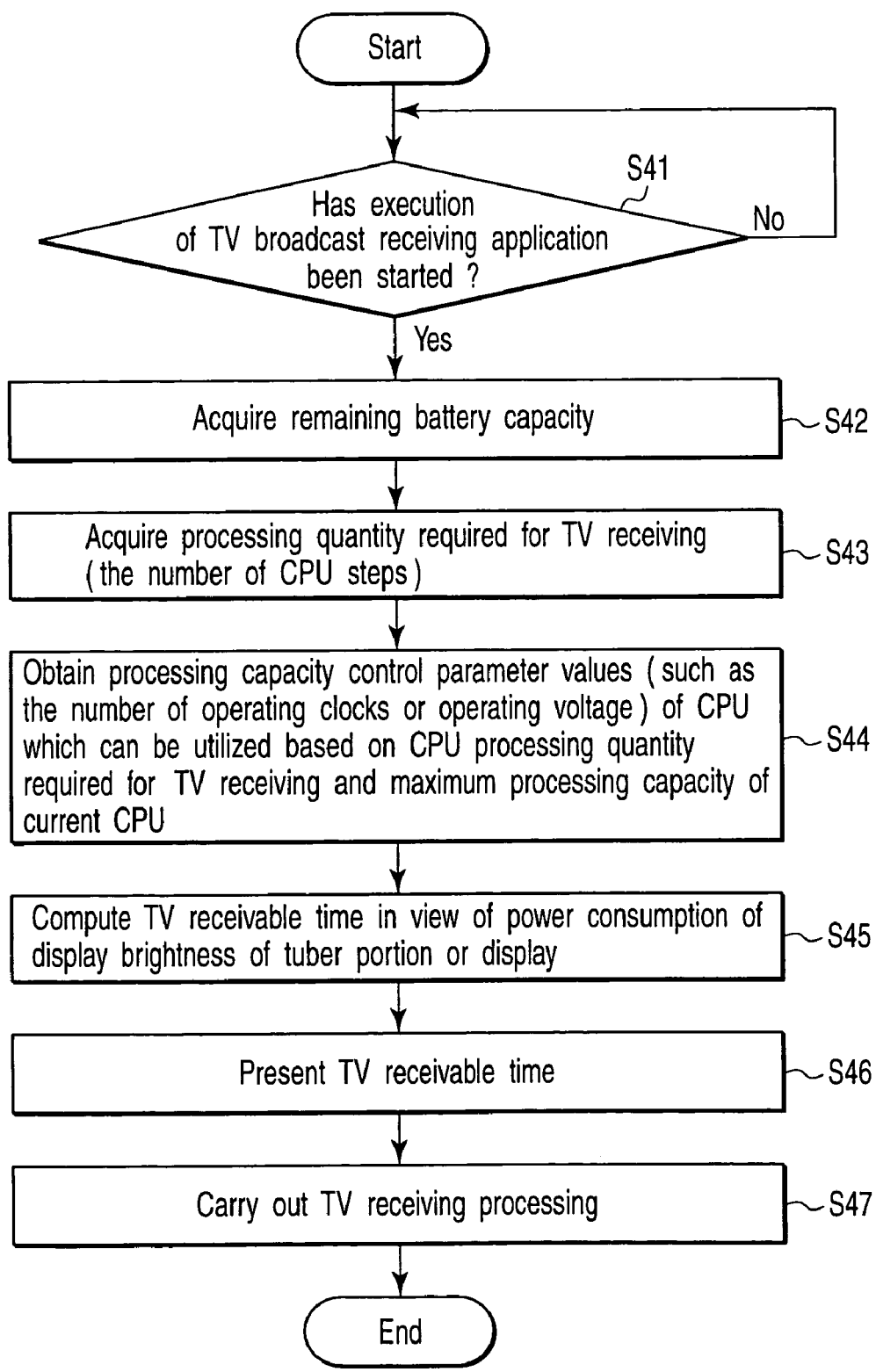
FIG. 8 is a flow chart showing another example of the operation of the information processing apparatus according to the present invention.
Figure 9:
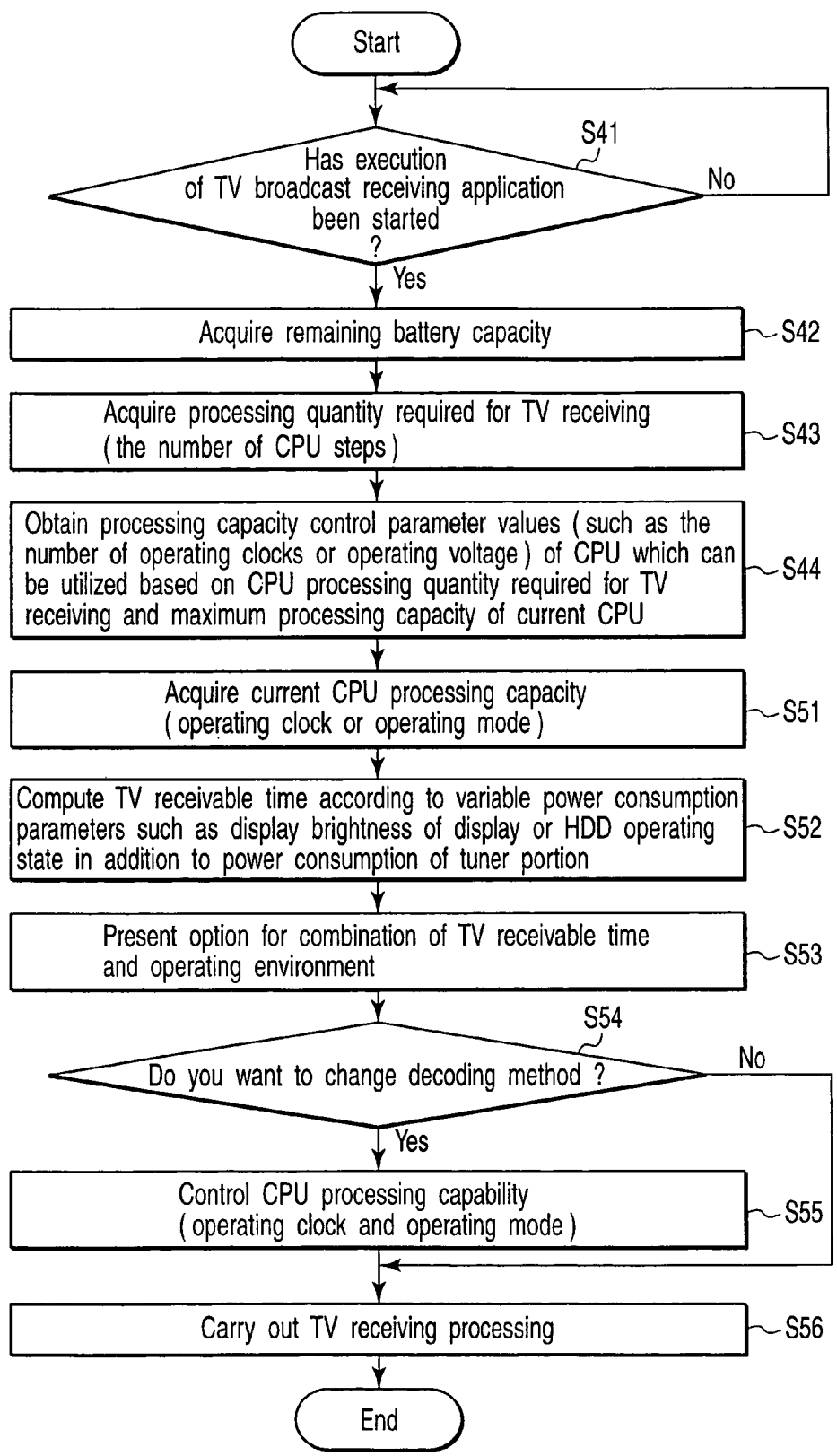
FIG. 9 is a flow chart showing another example of the operation of the information processing apparatus according to the present invention.
Figure 10:
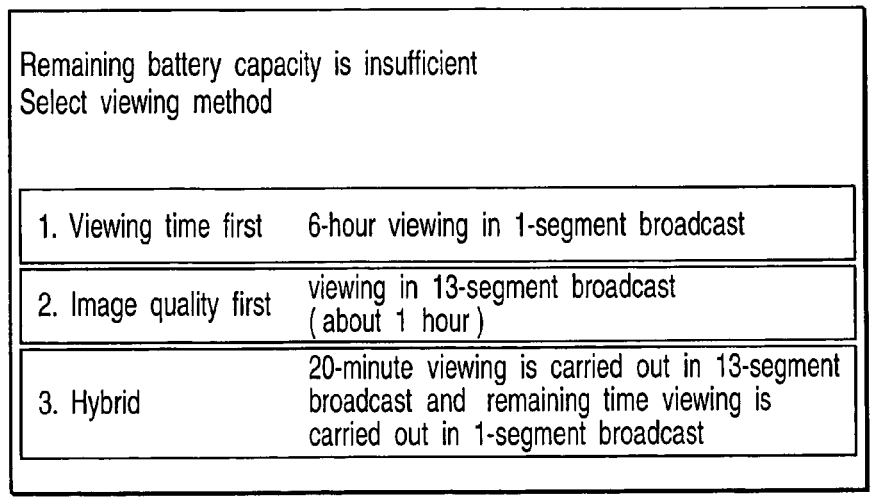
FIG. 10 is an explanation view illustrating an example of a selection screen of the information processing apparatus according to the present invention.
Figure 11:
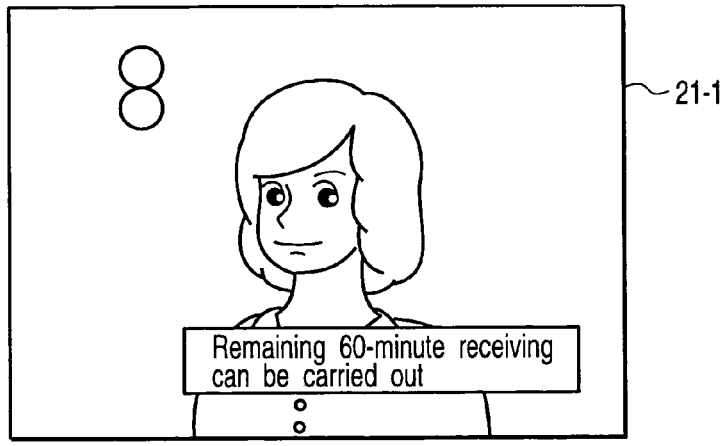
FIG. 11 is an explanation view illustrating an example of a display screen of the information processing apparatus according to the present invention.
Figure 12:
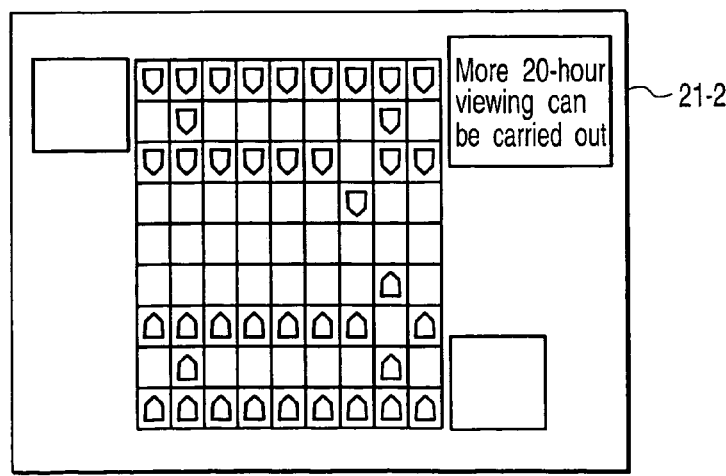
FIG. 12 is another illustrative view illustrating another example of the display screen of the information processing apparatus according to the present invention.

Now, a function for displaying a remaining battery capacity of the information processing apparatus according to the present invention will be described in detail with reference to the accompanying drawings. FIG. 3 is a graph depicting a voltage-capacity curve of a battery which this information processing apparatus uses. FIG. 4 is a view showing an example of a relationship between each function and power consumption of this information processing apparatus. FIG. 5 is a flow chart showing an example of an operation of the information processing apparatus. FIG. 6 is a flow chart showing another example of the operation of this information processing apparatus. FIG. 7 is a flow chart showing another example of the operation of this information processing apparatus. FIG. 8 is a flow chart showing another example of the operation of this information processing apparatus. FIG. 9 is a flow chart showing another example of the operation of this information processing apparatus. FIG. 10 is an explanation view illustrating an example of a selection screen of this information processing apparatus. FIG. 11 is an explanation view illustrating an example of a display screen of this information processing apparatus. FIG. 12 is an explanation view illustrating another example of the display screen of this information processing apparatus.

The above-described information processing apparatus 1 is of mobile type such as a portable phone set or PDA or a notebook personal computer (PC), and all applications are mainly operated by a battery. In such an information processing apparatus 1, the size of the battery portion 10 affects the size of the whole apparatus. Thus, there is a user's demand for operating an application for a long period of time while the battery portion 10 is sized as small as possible.

Therefore, in the information processing apparatus according to the present invention, the remaining capacity of the battery portion 10 is precisely recognized. Further, power consumption on an application by application basis is stored in advance, and an executable remaining time on an application by application basis is displayed on the basis of these applications. In this manner, an optimal option can be provided in response to a user's detailed demand.

That is, for example, in TV receiving, by displaying a remaining time, a user switches a 13-segment high image quality TV broadcast with large power consumption into a 1-segment normal image quality TV broadcast, and hears the broadcast, thereby enabling a selection of ensuring a battery capacity for, for example, 10-minute communication processing and 6-hour wait processing.

Hereinafter, an operation of the information processing apparatus according to the present invention will be described with reference to a flow chart of FIG. 5. The information processing apparatus 1, as an example, displays a remaining battery capacity by means of an application startup command, for example, by TV reception of terrestrial digital television or the like. First, in the powered information processing apparatus 1, for example, TV receiving such as a terrestrial digital television is commanded, and selection of channel 8 is triggered (S11). Alternatively, by the user operation, it is triggered that an operation for prompting display of a remaining time is made (S12), and the battery voltage detecting portion 24 of FIG. 1 detects a voltage of the battery portion 10 (S13). This voltage value is, for example, A/D converted, and the converted voltage is supplied to the MPU 15. Then, a current voltage value of the battery portion 10 is precisely transmitted.

Here, the MPU 15, for example, in a memory portion 17, stores in advance information on correlation (refer to FIG. 3) between a voltage and a remaining capacity (here, a remaining capacity is specified by WH (Watt hour), according to type of the battery portion 10 currently used, for example, type such as a lithium ion battery or type, or a nickel hydrogen battery. In the graph of FIG. 3, for example, if a voltage value applied from the battery voltage detecting portion 24 is 4.9 V, it is found that the remaining capacity remains 50%. Therefore, if the capacity of 100 V is 6 WH, the remaining capacity of 3 WH at this time point is obtained by computation (S13).

Now, the MPU 15, for example, acquires information stored in advance from the memory 17 or the like, the information indicating power consumption of a plurality of applications as shown in FIG. 4. In FIG. 4, for example, in the case of television receiving processing/13-segment decode processing/display processing, power consumption is 3000 mW. In the case of the remaining capacity of 3 WH, the remaining time of 1 hour is computed (S14). Therefore, as shown in FIG. 11, a message indicating a remaining time, for example, "remaining receiving time is 60 minutes" or the like is displayed on the LCD monitor portion 21. In this manner, a user can know the remaining battery capacity specifically as compared with a case in which only information such as full charging or insufficient capacity can be obtained in a conventional apparatus. Thus, how to use an application according to convenience can be contrived. FIG. 12 shows a display example in the case of an application other than TV receiving, for example, a television game mainly composed of a still image.

Here, in the power consumption information of FIG. 4, apart from the above-described television receiving processing/13-segment decoding processing/display processing, there are provided: television receiving processing/1-segment decoding processing/display processing; television receiving processing/1-segment decoding processing/recording processing; television receiving processing/recording processing in the case of recording without decoding or displaying operation; motion image recording processing; and motion image reproduction processing. Further, there are provided: a video game mainly composed of a motion image and voice; a table game mainly composed of a still image; wait processing of a portable phone; communication processing of a portable phone; receiving processing for a radio broadcast; recording processing for a radio broadcast (including receiving processing); and reproduction processing for a voice file. Furthermore, there are provided: recording processing for a still image utilizing the CCD portion 13; and reproduction processing for a still image. In addition, this power consumption information may be first fully measured and produced or may be updated every predetermined period of time. Alternatively, the above information may be obtained by measuring it when used.

Furthermore, as a basic function of the information processing apparatus 1, for example, power consumption can be defined for communication processing of a predetermined time (for example, 10 minutes) of a portable phone function or for wait processing of a predetermined period of time (for example, 8 hours). It is preferred that the remaining time at which another application can be started up is indicated after thus ensuring the basic function. Here, it is indicated that wait processing can be carried out for 59 hours after enduring 10-minute communication processing or 8-hour wait processing which is a basic function.

In order to ensure a capacity of the battery portion 10 for holding a basic function, in the case where the capacity of the battery portion 10 is lowered up to a value which ensures a basic function, it is preferred that an operation of an application is stopped any more. In this manner, for example, one watches a TV for a long period of time using the information processing apparatus 1, thereby making it possible to avoid such a failure that an important function of a portable phone is not available. The content of this basic function can be arbitrarily set according to the user's demand with the functions of the MPU 15 and memory portion 17.

Now, turning to the flow chart of FIG. 5, after a remaining time has been displayed, for example, as shown in FIG. 10, a display prompting you to change a method of processing an application is made (S16). Here, when priority is given to a viewing time, if a 13-segment broadcast is switched to a 1-segment broadcast, it is indicated that 6-hour viewing can be carried out. Further, in the 13-segment broadcast, a message indicating a remaining 1 hour or 20 minutes in 13-segment broadcast, and hybrid selection such as remaining viewing in 1-segment broadcast are indicated altogether. In this manner, it becomes possible to select an optimal use method according to the user convenience. Here, if a user's command for changing the processing method occurs (S17), the method for processing an application is changed (S18), and then, application processing continues (S19).

Now, a method of displaying a remaining battery capacity shown in the flow chart of FIG. 6 will be described here. That is, application startup is commanded (S11). Then, a voltage of the battery portion 10 is measured, and a remaining capacity of the battery portion is computed on the basis of information on a correlation between the voltage and the capacity (S13). Then, only in the case where the remaining capacity is equal to or smaller than a predetermined value (for example, 50%), the remaining time is displayed (S21). By doing this, in the case where charging is sufficiently made, a display of the remaining time is omitted. Thus, the user inconvenience is eliminated, and at the same time, a display is made if the remaining capacity becomes insufficient. The steps S14 to S19 are identical to those in FIG. 5. Monitoring of the remaining capacity of the battery portion 10 may be automatically carried out by a predetermined time (for example, 15 minutes) as well as a case in which an application startup command occurs.

Furthermore, a method of displaying a remaining battery capacity shown in the flow chart of FIG. 7 will be described here. In TV receiving processing, in the case where a user issues a command for selecting a channel via the operating portion 16 (S31), a desired station is selected by the tuner portion 11. Then, the received signal is demodulated, and the received image is displayed on the monitor portion 21. Thereafter, by means of the tuner portion 11, RPG (Electronic Program Guidance) information for that number is acquired from a program signal being received. Alternatively, as an example, the mobile communication portion 200 acquires EPG information through the Internet via a telephone line. From this EPG information, a remaining broadcast time of a program being received is computed in the light of a current time (S32). Moreover, it is determined whether or not the residue of the program can be broadcasted with the current remaining capacity of the battery portion 10 (S33). For example, if the residue of a two-hour program is 1 hour 20 minutes based on EPG information, and all the remaining broadcast time cannot be received with power consumption during 13-segment broadcast receiving, a proposal is made to show a change from 13 segments to 1 segment in FIG. 10. When this is agreed (S34), 1-segment decoding is carried out (S35).

Further, in step S34, in the case where a change to 1 segment has been rejected, a proposal is made to lower liquid crystal brightness and restrict power consumption. When an agreement is obtained (S36), the LCD monitor portion 21 is displayed at low luminance (S37). By carrying out such reception processing (S38), the remaining time of program information is obtained by utilizing EPG information. In this manner, a required change of the processing method can be made while the remaining time is displayed, and a receiving environment optimal to a user is achieved.

Now, another method of displaying a remaining battery capacity will be described in accordance with the flow chart of FIG. 8. In this method, unlike a case in which computation is made based on the above-described power consumption information of FIG. 4, the remaining time is computed based on the number of CPU steps or the like. In FIG. 8, when execution of a television broadcast receiving application is started (S41), a voltage of the battery portion 10 is measured, and the remaining capacity of the battery portion is acquired based on information on a correlation between the voltage and the capacity (S42). Then, a required processing quantity for TV receiving (the number of CPU steps) is acquired (S43). Then, processing capability control parameter values (the number of operating clocks, an operating voltage and the like) are obtained on the basis of the CPU processing quantity required for TV receiving and a current CPU maximum processing capability (S44). Then, a TV receivable time is computed in view of power consumption of a display brightness of the tuner portion or the LCD monitor portion 21 (S45). The time enabling TV receiving is then displayed on the LCD monitor portion 21 (S46).

Thereafter, TV receiving processing is continued (S47). In this way, it is preferred that the remaining time of TV receiving is obtained on the basis of the number of CPU steps or the like.

Now, another method of displaying a remaining battery capacity will be described in accordance with the flow chart of FIG. 9. In FIG. 9, like processing is carried out with respect to steps S41 to S44. In step S51, a current CPU processing capability (operating clock and operating mode) is acquired (S51). The TV receivable time is computed according to variable power consumption parameters such as the display brightness of the display and the operation state of the HDD in addition to power consumption or the like of the tuner portion (S52). That is, a plurality of options for power consumption is generated in a variable range. Next, a plurality of options for a combination of the TV receivable time and the operating environment are presented (S53). This example seems to be various. By showing an example of TV receiving, there are options for 13-segment broadcast receiving and 1-segment broadcast receiving as the above-described digital broadcast, and options for brightness on the LCD monitor portion 21 may be reduced. In another application as well, many more options affecting power consumption are included.

Here, when the user issues a command to a decoding method from 13 segments to 1 segment (S54), the CPU processing capacity is controlled according to such a change (S55), and TV receiving processing is continued (S56).

In this way, according to the method shown in FIG. 9, in particular, in step S51, the remaining time of an application is computed in view of the current CPU processing capability, and thus, more accurate remaining time can be provided. Further, a change of an application processing method is proposed to a user, thus making it possible to execute an optimal application according to the user's demand.

Another Embodiment

Furthermore, in the above-described information processing apparatus according to the present invention, if a user specifies a desired time for viewing prior to program viewing, it is preferred that a proper receiving method is checked from the remaining battery quantity at that time, and is notified to the user such that the user can select and specify it easily.

That is, in the case where an attempt is made to watch a 1-hour problem, when a request is made for 1-hour viewing, information indicating that 1-hour viewing can be carried out by switching 13-segment broadcast receiving to a segment broadcast may be provided to a user on a menu or the like such that the user can make a selection in advance.

During the above-described 1-segment broadcast receiving, it is preferred that CPU operation is made in a power saving mode in order to reduce battery exhaustion more effectively.

A notebook type PC or PDA, etc. may be used for another work (such as E-mail or word processing) after viewing a TV program. Thus, after the user has specified a remaining battery capacity by operation at the time of completion of program viewing, when the user specifies a desired time for viewing, it is preferred that a proper receiving method is notified to a user from the remaining battery quantity at that time, and easily selectable and specifiable processing is carried out.

That is, the MPU 15 computes a required capacity based on the application and use time specified by the user. Then, this MPU controls TV receiving to be carried out with respect to the remaining capacity obtained by subtracting this capacity from the current remaining battery capacity. Further, in the remaining capacity, a proper receiving method is present to the user in view of power consumption of that receiving method.

In addition, in the case where a battery capacity is extremely small, as one TV receiving method, it is preferred hat an option is provided for temporarily recording a program in a recording medium with comparatively small power consumption such as an SD memory which is the external memory portion 18 instead of decoding and displaying the program in real time. In this case, actual viewing is carried out by reproduction from the recording medium under an equipment environment free of restriction on power supply.

Decoding processing may not be carried out by software, and may be carried out by hardware mounted on or incorporated in a hardware independent PC or PDA mainframe.

As has been described above, in the information processing apparatus according to the present invention, a remaining capacity of a battery is detected, and a remaining time during which a specific application can be used is computed according to the detected remaining capacity of the battery. Then, the computed remaining time is displayed on a liquid crystal display screen or the like. That is, in the information processing apparatus in which a television broadcast can be received, for example, information on a relationship between a voltage and a remaining capacity of a battery is allocated in advance according to the type of the battery. Then, from this relationship information, the current remaining capacity of the battery can be specified by precisely measuring a current battery potential. Further, for example, in the case of television broadcast receiving processing, power consumption for that purpose is measured in advance, and the measurement data is stored. By doing this, a receivable time according to the remaining capacity of the battery at that time can be computed. This computation result is displayed on a liquid crystal display screen on which a television broadcast being received is displayed, together with a television screen, whereby, for example, the user can know that 1-hour receiving can be carried out with the current remaining capacity of the battery.

At this time, for example, a change from 13-segment mode to 1-segment mode is prompted on a screen of the information processing apparatus, thereby making it possible to provide to the user an option that, even if an image quality is lowly suppressed, a 2-hour program can be fully viewed.

What is claimed is:

1. A portable information processing apparatus comprising:

a battery portion which supplies power;

a tuner portion which receives a first television broadcast and a second television broadcast;

a remaining capacity detecting portion which detects a remaining capacity of the battery portion;

a remaining time computing portion which computes a remaining time for a television broadcast receiving function performed by the tuner portion based on the remaining capacity detected by the remaining capacity detecting portion;

a display portion which displays the remaining time computed by the remaining time computing portion; and a control portion which changes decoding of the first television broadcast to decoding of the second television broadcast when the remaining capacity detecting portion determines that the remaining capacity of the battery portion is equal to or smaller than a predetermined value.

2. A portable information processing apparatus according to claim 1, wherein the control portion generates a prompt on the display portion providing a user an option to change decoding of the first television broadcast to decoding of the second television broadcast when the remaining capacity detecting portion determines that the remaining capacity of the battery portion is equal to or smaller than a predetermined value, and the control portion changes the decoding of the first television broadcast to the decoding of the second television broadcast when the control portion receives an instruction signal from the user.

3. A portable information processing apparatus of claim 1, wherein the first television broadcast is a high data rate thirteen segment broadcast and the second television broadcast is a low data rate one segment broadcast.

4. A portable information processing apparatus comprising:
- a battery portion which supplies power;
- a tuner portion which receives a first television broadcast and a second television broadcast;
- a remaining capacity detecting portion which detects a remaining capacity of the battery portion;
- a remaining time computing portion which computes a remaining time for a television receiving function performed by the tuner portion based on the remaining capacity detected by the remaining capacity detecting portion;
- a display portion which displays the remaining time computed by the remaining time computing portion; and
- a control portion which, when the television receiving function is being performed and a predetermined channel is selected, computes a remaining broadcast time of a program being received by the channel from acquired electronic broadcast information; determines whether the program can be broadcasted for the remaining broadcast time based on the remaining capacity detected by the remaining capacity detecting portion; and generates a prompt on the display portion providing a user an option to change decoding of the first television broadcast to decoding of the second television broadcast if the determination result is negative.

5. A portable information processing apparatus of claim 4, wherein the first television broadcast is a high data rate thirteen segment broadcast and the second television broadcast is a low data rate one segment broadcast.

6. A portable information processing apparatus comprising:
- a battery portion which supplies power;
- a tuner portion which receives a broadcast;
- a remaining capacity detecting portion which detects a remaining capacity of the battery portion;
- a remaining time computing portion which computes a remaining time for a television receiving function performed by the tuner portion based on the remaining capacity detected by the remaining capacity detecting portion;
- a display portion which displays the remaining time computed by the remaining time computing portion; and
- a control portion which, when the television receiving function is being performed and a predetermined channel is selected, computes a remaining broadcast time of a program being received by the channel from acquired electronic broadcast information; determines whether the program can be broadcasted for the remaining broadcast time based on the remaining capacity detected by the remaining capacity detecting portion; and generates a prompt on the display portion providing a user an option to change brightness of the display portion if the determination result is negative.

* * * * *